US 8,861,669 B2

(12) United States Patent
Zhang et al.

(10) Patent No.: US 8,861,669 B2
(45) Date of Patent: Oct. 14, 2014

(54) STREAM CLOCK RECOVERY IN HIGH DEFINITION MULTIMEDIA DIGITAL SYSTEM

(75) Inventors: Xiaoqian Zhang, Shanghai (CN); Shubing Zhai, Shanghai (CN); Yanbo Wang, Shanghai (CN)

(73) Assignee: Synaptics Incorporated, San Jose, CA (US)

( * ) Notice: Subject to any disclaimer, the term of this patent is extended or adjusted under 35 U.S.C. 154(b) by 530 days.

(21) Appl. No.: 12/571,210

(22) Filed: Sep. 30, 2009

(65) Prior Publication Data

US 2011/0075782 A1    Mar. 31, 2011

(51) Int. Cl.
*H03D 3/24*     (2006.01)
*H03L 7/197*    (2006.01)
*H04N 21/43*    (2011.01)
*H03L 7/193*    (2006.01)
*H04N 21/41*    (2011.01)
*H04J 3/06*     (2006.01)
*G09G 5/00*     (2006.01)

(52) U.S. Cl.
CPC ............. *H04J 3/062* (2013.01); *H03L 7/1978* (2013.01); *H04N 21/4307* (2013.01); *H03L 7/193* (2013.01); *H04N 21/4122* (2013.01); *G09G 5/008* (2013.01)
USPC ........................................................ 375/376

(58) Field of Classification Search
USPC .......... 375/354–355, 326, 375–376; 327/141, 327/156, 291
See application file for complete search history.

(56) References Cited

U.S. PATENT DOCUMENTS

| | | | |
|---|---|---|---|
| 5,844,891 A * | 12/1998 | Cox | 370/395.62 |
| 6,044,124 A * | 3/2000 | Monahan et al. | 375/376 |
| 6,630,868 B2 | 10/2003 | Perrott et al. | |
| 7,079,595 B2 * | 7/2006 | Jensen et al. | 375/319 |
| 7,102,399 B2 | 9/2006 | Wu | |
| 7,176,928 B1 * | 2/2007 | Sendrovitz | 345/534 |
| 7,295,644 B1 * | 11/2007 | Wu et al. | 375/375 |
| 7,355,539 B2 * | 4/2008 | Petersen et al. | 341/143 |
| 7,365,580 B2 * | 4/2008 | Martin et al. | 327/156 |
| 7,567,630 B2 | 7/2009 | Boehl et al. | |
| 7,715,513 B2 * | 5/2010 | Lin et al. | 375/372 |
| 7,742,553 B1 * | 6/2010 | Bataineh et al. | 375/376 |
| 7,801,261 B2 * | 9/2010 | Chakravarthy | 375/376 |
| 7,911,241 B1 * | 3/2011 | Zeller | 327/105 |
| 7,986,190 B1 * | 7/2011 | Lye | 331/1 A |

(Continued)

OTHER PUBLICATIONS

PCT International Preliminary Report on Patentability and the Written Opinion mailed Apr. 12, 2012, in related International Application No. PCT/US2010/050929.

(Continued)

*Primary Examiner* — Jean B Corrielus
(74) *Attorney, Agent, or Firm* — Osha Liang LLP

(57) ABSTRACT

The present disclosure provides techniques for recovering source stream clock data at the sink in a high definition multimedia digital content transport system. The disclosure includes a fractional-N Phase-Locked Loop (PLL) based clock generator, a programmable Sigma-Delta Modulator (SDM), and a clock data calibrator to fully recover the original source stream clock data. The fractional-N PLL provides flexible source stream clock recovery. When there is a frequency deviation between the original clock and the regenerated clock, the clock data calibrator control circuit adjusts the clock data, preventing any stream data buffer overflow or underflow problems. The disclosed techniques are compatible with the sink devices based on the standards of Display-Port and HDMI.

10 Claims, 8 Drawing Sheets

(56) References Cited

U.S. PATENT DOCUMENTS

| | | |
|---|---|---|
| 2003/0086518 A1* | 5/2003 | Chakravarthy ............... 375/359 |
| 2005/0057384 A1* | 3/2005 | Chen et al. .................... 341/143 |
| 2005/0197064 A1* | 9/2005 | Ibrahim et al. ................ 455/41.2 |
| 2006/0034394 A1* | 2/2006 | Popescu et al. ............... 375/326 |
| 2006/0161799 A1* | 7/2006 | Degenhardt ................... 713/600 |
| 2008/0186972 A1* | 8/2008 | Guo ............................... 370/394 |
| 2008/0212619 A1* | 9/2008 | Scott et al. .................... 370/503 |
| 2009/0072874 A1* | 3/2009 | Sundstrom .................... 327/179 |
| 2009/0147897 A1* | 6/2009 | Shin .............................. 375/355 |
| 2009/0232262 A1 | 9/2009 | Ku et al. |
| 2009/0296869 A1* | 12/2009 | Chao et al. .................... 375/376 |
| 2010/0289593 A1* | 11/2010 | Chen et al. ................. 331/177 R |
| 2011/0006936 A1* | 1/2011 | Lin et al. ....................... 341/143 |
| 2011/0150168 A1* | 6/2011 | Tseng et al. .................... 377/47 |

OTHER PUBLICATIONS

PCT International Search Report and the Written Opinion mailed Nov. 26, 2010, in related International Application No. PCT/US2010/050929.

* cited by examiner

STREAM CLOCK RECOVERY IN HIGH DEFINITION MULTIMEDIA DIGITAL SYSTEM

TECHNICAL FIELD

The present invention is generally related to the field of stream clock and data recovery in digital communication and, more specifically, to reduction of frequency errors in a high definition multimedia digital content transport system.

DISCUSSION OF RELATED ART

A high definition multimedia digital content transport system typically includes a source device, a sink device, and perhaps a number of additional repeaters or other devices, interconnected by a uni-directional, high-speed, and low-latency serial link channel designed to transport isochronous streams such as uncompressed digital video and digital audio. In order to transmit video and audio data across a link channel, a packet structure is used. Frequently in its simplest form, a source includes transcoders which convert incoming video and audio stream data between a non-standard interface and a standard interface, as well as link channel transmitters integrated with graphics, video, and audio processors. A sink includes link channel receivers combined with other display and audio related devices and integration components for higher level functionalities. Recently, a high-definition multimedia interface (HDMI) and DisplayPort for transmitting digital video and audio content have been standardized by Video Electronics Standard Association (VESA).

The task of recreating the video pixel clock rate or the audio sample clock rate at the sink side is called stream clock recovery. There are a variety of stream clock recovery methods that can be implemented at the sink, each method having a different set of performance characteristics. Unfortunately, the clock rate measured at the sink side is not always equal to the original clock rate at the source site and many of the stream clock recovery methods do not provide satisfactory and practical solutions. Accordingly, it is desirable to provide for improved stream clock recovery methods.

SUMMARY

Consistent with embodiments of the present invention, a stream clock recovery device is provided. In some embodiments, the clock recovery device includes a video and audio data source containing a transmitter, wherein the data includes a clock signal; a sink device receiving the data from a link channel connecting to the transmitter; the sink device further including: a data extractor to extract the clock data; a data calibrator to recover the clock data; a data translator having a fraction and integer value generator; a phase locked loop (PLL) for synthesizing a fractional frequency; and a sigma-delta-modulator (SDM) for generating a fractional divisor for the PLL by modulating the fractional part of the clock data. In some embodiments, the clock data calibrator can switch between different calibration methods. For example, the recovered clock data can be measured with a cycle time counter and compared with the extracted clock data. Another example method monitors the data buffer filling level periodically.

BRIEF DESCRIPTION OF THE DRAWINGS

Some embodiments of the present invention will be described more fully below with reference to the accompanying drawings. This invention may, however, be embodied in many different forms and should not be construed as being limited to the embodiments set forth herein.

DETAILED DESCRIPTION

In the following description, specific details are set forth describing some embodiments of the present invention. It will be apparent, however, to one skilled in the art that some embodiments may be practiced without some or all of these specific details. The specific embodiments disclosed herein are meant to be illustrative but not limiting. One skilled in the art may realize other material that, although not specifically described here, is within the scope and the spirit of this disclosure.

Figure 1:
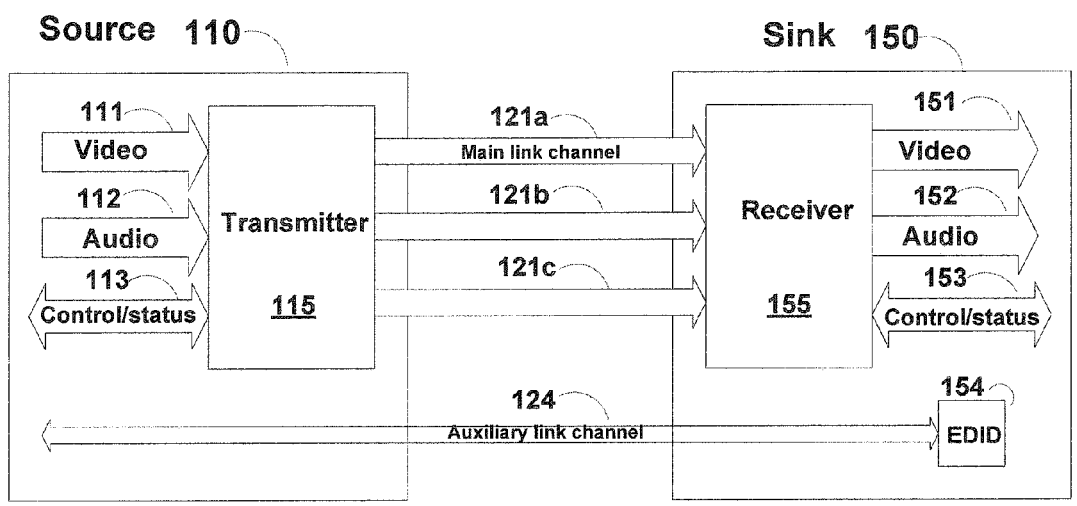
FIG. 1 shows an example of a high definition multimedia digital content transport system.

FIG. 1 shows a general architecture of a high definition multimedia digital content transport system. Such a system typically includes a source device 110 that includes a transmitter 115, a sink device 150 that includes a receiver 155, and perhaps a number of additional repeaters or other devices, interconnected by one or more uni-directional, high-speed, and low-latency serial main link channels 121 (link channels 121a, 121b, and 121c are specifically shown) designed to transport isochronous streams such as uncompressed digital video data 111, digital audio data 112, and control/status data 113. At the sink 150, receiver 155 receives and outputs a video signal 151, an audio signal 152 and a control/status signal 153. In addition, an auxiliary link channel 124 can be utilized to transport data 154, which may include Extended Digital Identification Data (EDID).

Figure 2:
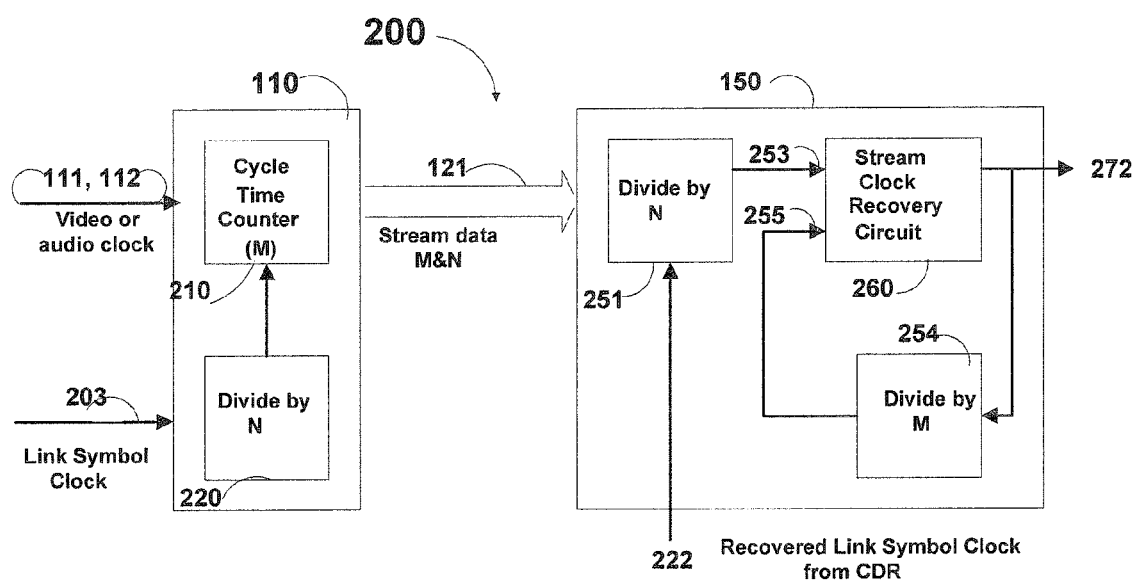
FIG. 2 shows a clock regeneration model in a time stamped fractional relationship.

In many stream clock recovery systems, the video data 111 and audio stream data 112 being carried across the main serial link channel 121 may not retain the original video pixel clock rate or audio sample clock rate. The serial link channel 121 is driven by a high speed clock running at a different rate and not at the original video pixel clock rate or the audio sample clock rate. For example, in the DisplayPort standard, the main serial link channel 121 clock rate is fixed at either 1.62 Gbps or 2.7 Gbps irrespective of the input video or audio clock rate. In the HDMI standard, the main serial link channel 121 clock runs at the TMDS (Transition Minimized Differential Signaling) clock rate which corresponds to the video pixel rate, but is independent of the audio sample clock rate. In both HDMI and DisplayPort standards, a fractional relationship time-stamped clock regeneration model 200 such as that shown in FIG. 2 can be defined. The values M and N are integers representing frequencies in clock recovery. M is a dynamic parameter that is counted and N is a static parameter that depends on the relevant communication standard of the system. Source 110 includes a cycle time counter 210 to count the frequency parameter M from input video clock 111 and audio clock 112. A link symbol clock 203, which typically runs at 10 percent of the clock rate of the main link channel 121, drives a "divide by N" operation, performed by a divider 220, to the counted frequency parameter M from the cycle time counter 210. The stream data including M and N is carried by main link channel 121 to sink 150. Sink contains a stream clock recovery circuit 260, responsible for calculating the recovered stream clock 272. Operation at "divide by N" 251 provides a reference clock 253 and operation at "divide by M" 254 provides a feedback clock for stream clock recovery circuit 260.

When M and N values are transported from source 110 to sink 150, the source measures the clock cycle M using a counter 210 running at the link symbol clock frequency (usually 1/10 of channel clock rate). N can be a fixed value defined by the communication standard used, for example, N is set to 32768 ($2^{15}$) in the DisplayPort standard. The value M measured by counter 210 is transported in a serial main link channel 121 as part of a packet structure. The stream clock signals transported by main link channel 121 and link symbol clock signals 203 at source 110 are asynchronous with each other, thus the value M might change while the value N stays constant. The stream clock rate from serial main link channel 121 can be derived from the link symbol clock by using the relationship stream clock rate=M/N*(link symbol clock rate).

Figure 3:
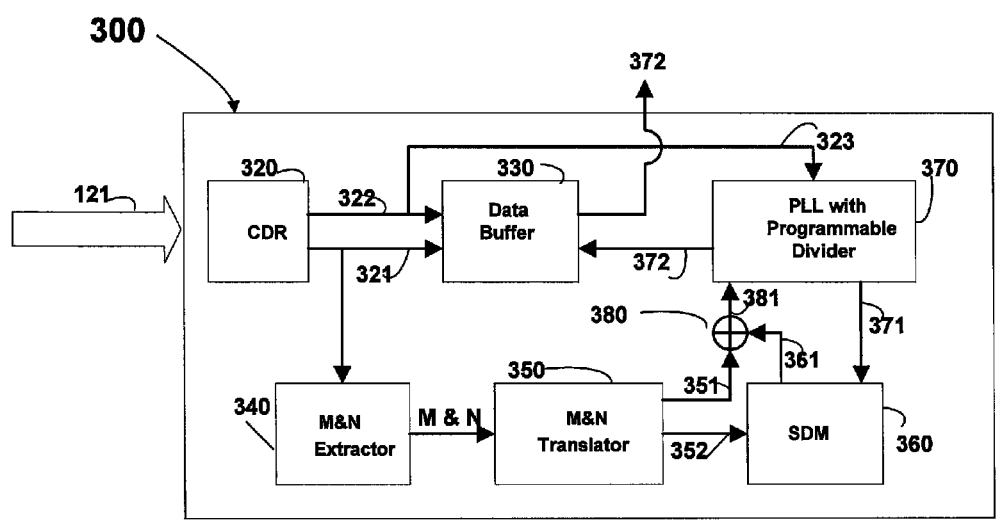
FIG. 3 illustrates a conventional stream clock recovery sink circuit.

There are a variety of stream clock recovery methods that can be implemented at sink 150. Each method has a different set of performance characteristics. FIG. 3 illustrates a conventional stream clock recovery sink circuit 300 in sink 150. As illustrated in FIG. 3, a typical conventional stream clock recovery sink circuit 300 includes the following components: a clock-data-recovery (CDR) circuit 320 receiving clock data from a main link channel 121 and outputting a recovered link symbol clock data 322 and other stream clock data 321 to a data buffer 330; an M&N extractor 340 that also receives the CDR output stream clock data 321 to extract the values of M and N; an M&N translator 350 to operate on the clock rate in order to generate an integer 351 (I1) and a fractional value 352 (F); a Sigma-Delta-Modulator (SDM) 360 that is employed to adjust the fractional values 352 (F) into a fractional divisor ratio 361 (I2); and an adder 380 that receives integers 351 and 361 and generates a variable divisor input 381 (D) for a phase-locked-loop (PLL) with a programmable divider 370. Thus, the average division ratio 361 (I2) over many cycles is still equal to the output fractional value 352 from the M & N Translator 350.

Moreover, SDM 360 shapes the noise spectrum of its output with a high pass filter, which suppresses noise at low frequencies. PLL 370 acts as a low pass filter to reject high frequency response. As a result, the overall noise is attenuated, and the recovered stream clock rate 372 is used to read stream data, which is stored at data buffer 330.

A problem occurs for the above stream clock recovery method, when the M & N values at sink 150 are not equal to the original M & N values at the source, which is typically caused by bit error in link channel 121 or imperfect measurement mechanisms at source 110. In the ideal case, where the received M & N values are equal to the original M & N values, fractional long-term accuracy of the recovered stream clock is the same as that of the original. But in the non-ideal case where the received M & N values are not equal to the original M & N values, frequency deviation between source 110 and sink 150 will accumulate over time, leading to a phase offset between read and write operations in data buffer 330 that may eventually cause buffer 330 overflow or underflow.

Figure 4:
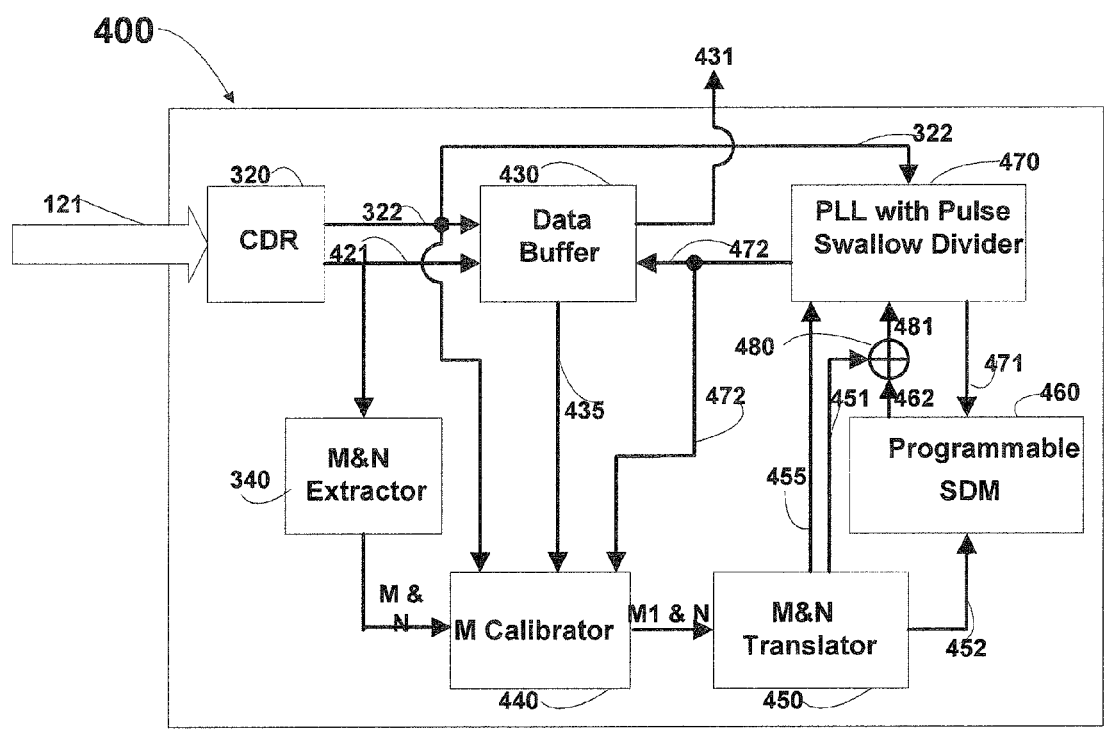
FIG. 4 describes an embodiment of the disclosed stream clock recovery circuit.

FIG. 4 shows a block diagram for a stream clock recovery system 400 according to some embodiments of the present invention. Stream clock recovery system 400 includes: a clock-data-recovery (CDR) circuit 320 receiving clock data from a main link channel 121 and delivering a recovered link symbol clock data 322 and stream clock data 421 to a data buffer 430; M & N Extractor 340; M Calibrator 440; M & N Translator 450; a Programmable SDM 460; an adder 480; and a PLL with Pulse-Swallow Divider 470. M and N values are extracted from the link channel stream packets after CDR 320 by the M & N Extractor 340. N value is a fixed number and N is not changed by the extraction. M values are sent to M calibrator 440 and adjusted to form M1 values by M calibrator 440. M Calibrator 440 can utilize several calibration methods, including the following: 1) direct comparison of the difference between the original stream clock rate, m-values and the recovered stream clock rate M-value; and 2) indirect monitoring of the data buffer filling level. M Calibration 440 will converge M1 to the original value during the calibration process. M & N Translator 450 calculates M1/N and converts the result into an integer value 451 (I1) and a fractional value 452 (F). The fractional value 452 (F) is modulated by a programmable SDM 460, which outputs a divisor ratio 462 (I2). Divisor ratio 462 (I2) is then summed with integer value 451 (I1) by adder 480 before entering PLL with Pulse-Swallow Divider 470. Although the instantaneous division ratio 462 (I2) varies, the average of 462 (I2) over many cycles still equals fraction value 452 (F). The frequency deviation between source 110 and sink 150 is then adjusted by one of the calibration methods. As a result, data buffer 430 will not overflow or underflow. Therefore, the recovered stream clock rate 472 can be used to read the stream data from the data buffer 430. The overall stream data clock recovery is correctly achieved.

Figure 5:
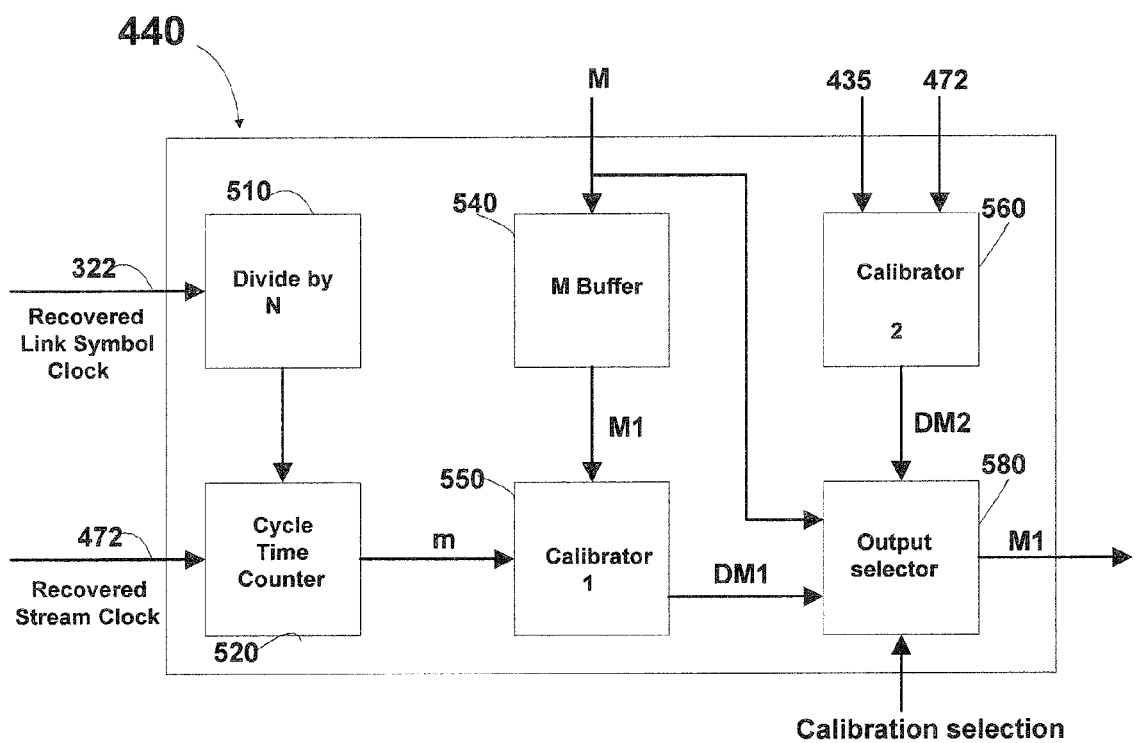
FIG. 5 illustrates a frequency M Calibrator consistent with some embodiments of the present invention.

FIG. 5 shows a block diagram of an embodiment of M calibrator 440, applying two alternative calibration methods to adjust the M value, consistent with some embodiments of the present invention. The first calibration device 550 directly measures the recovered stream clock cycles M-value m with a cycle time counter 520. Operation 520 to divide the M-value by N is performed at recovered link symbol clock rate 322. Then the difference DM1=M1−m is calculated by comparing the current measured stream clock cycle value m with the last calibrated value M1 of the previous packet coming from input 472 to cycle time counter 520. The output calibrated value for this technique is M1=m+DM1.

The second calibration device 560 monitors the buffer filling level 435 relative to a fixed buffer threshold at fixed reference time points 472, for example, at the horizontal blanking ending of an active line, then calculates the difference DM2=buffer filling level−buffer threshold. The output calibrated value for the second technique is M1'=M+DM2. Each of the selected calibration techniques has its advantages and disadvantages. The first calibration method does not need fixed timing reference in data stream 322, thus it can be applied to data stream in other video/audio standards in the future. However, method 1 may still have buffer overflow or underflow problems if the bit error rate of link channel 121 is extremely high. The second device can respond to high bit errors, although it requires fixed reference timing in the data stream. The second method is very suitable for DisplayPort, because DisplayPort has defined fixed timing reference in the serial data stream.

Figure 6:
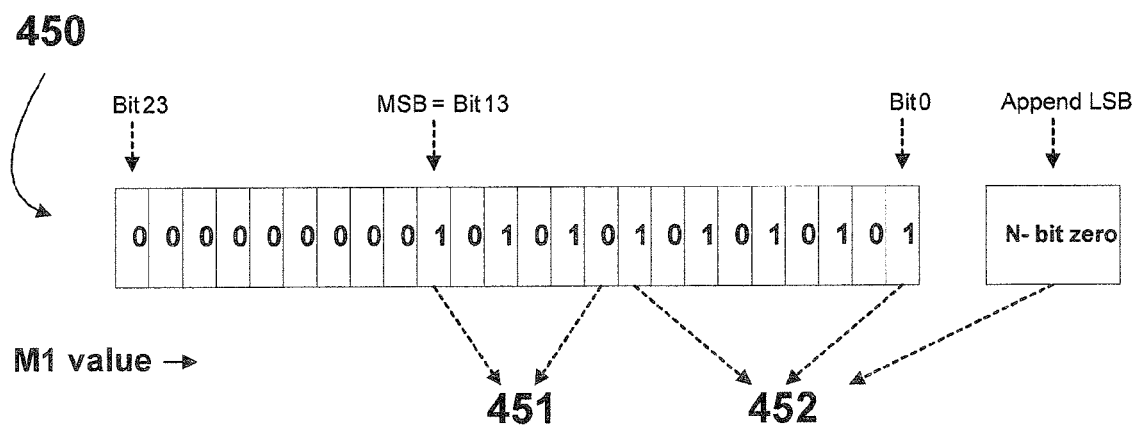
FIG. 6 illustrates a M & N translator consistent with some embodiments of the present invention.

FIG. 6 illustrates an exemplary M & N Translator 450 in accordance with some embodiments of the present invention. M & N translator 450 translates M & N values into an integer 451 (I1), a fraction 452 (F) and a selected divisional number Div_sel, which is $2^n$ (n=1, 2, 3, etc.). The least significant bit (LSB) carrying the N-bit zero is appended to the fractional value of 452. The value of Div_sel is static, but integer (I) and fraction (F) are dynamic because M is dynamic. The following equations define how the M & N Translator calculates the integers and fractions.

The Integer I and fraction values can be calculated by the following steps:

First, calculate DIV: DIV=16*M/N=M/2048, (when N=32768);

Second, find I(DIV) which is the integer part of DIV;

Third, choose n value so that I(DIV) multiplied with $2^n$ yields an integer between 32 and 63;

Finally, calculate the Integer I and fraction values by the following expressions:

$$\text{Integer } (I) = I(\text{DIV}*2^n) = I(M/2048*2^n);$$

$$\text{Fraction} = F(M/2048*2^n).$$

One example of the translation is illustrated in Table 2. For convenience, in some embodiments the most significant bit (MSB) is always kept as "1". Therefore, the integer of (DIV*$2^n$) is always between 32 and 63. For most of video formats defined in DisplayPort standard, the typical values of I1 and F post translation are listed in Table 1.

mable frequency divider 760 dividing by 2/4/8/16/32/64. PLL 470 takes the input signals—link symbol clock 322, the Div_sel 455 and a dynamic divisor 481 (D)—and outputs the recovered stream clock signal 472.

Typically, the link symbol clock rate 322 is fixed at 162 MHz or 270 MHz, thus after frequency division by 16 in Div_16 710, the reference clock of PFD 720 can be fixed at 10.125 MHz or 16.875 MHz and VCO 750 frequency range is from 314 MHz to 1.114 GHz. Prescaler 770 directly follows VCO 750, slowing down the output frequency of VCO 750. Thus, the programmable divider does not need to operate at the VCO speed because of the prescaler's 4/5 frequency dividing. The recovered stream clock divisor div_sel ($2^n$) 455 is provided by the M & N translator 450 of FIG. 4, and the divisor for the programmable divider is provided by the programmable SDM 460 in FIG. 4.

Figure 8:
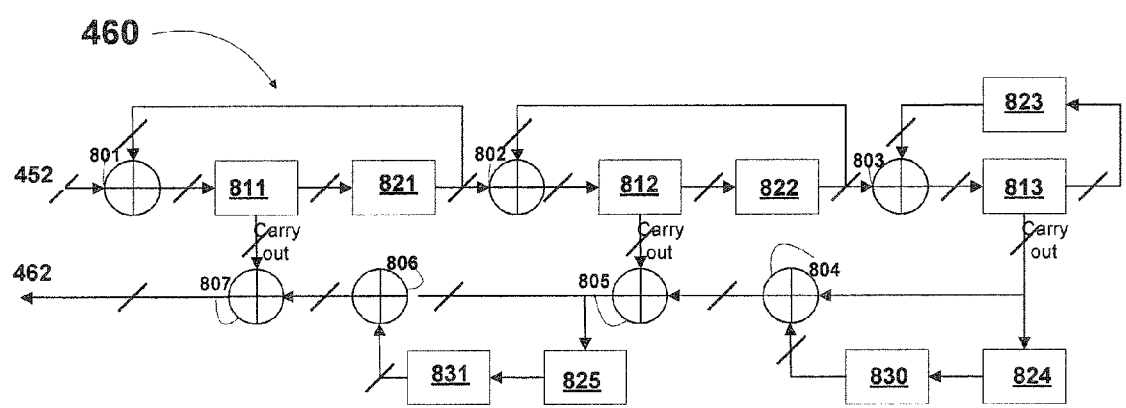
FIG. 8 illustrates a programmable SDM consistent with some embodiments of the present invention.

FIG. 8 shows a block diagram of a programmable third order MASH (Multistage Noise Shaping) 1-1-1 SDM 460 consistent with some embodiments of the present invention. FIG. 8 contains the following components: 3 integrators 811, 812, 813, adders 801-807, noise filters 821, 822, 823, and comparators (also known as quantizers) 830, 831. The input

TABLE 1

M & N Translator in standard video protocols

| Ls_clk (MHz) | Format | Strm_clk (MHz) | N | M | Integer.Fraction | Div_sel (= $2^n$) |
|---|---|---|---|---|---|---|
| 162 | WQXGA (2560 × 1600 60 Hz RB) | 268.5 | 32768 | 54310 | 53.037109 | $2^1$ |
|  | WSXGA (1680 × 1050 60 Hz) | 146.25 | 32768 | 29582 | 57.777344 | $2^2$ |
|  | SXGA (1280 × 1024 60 Hz) | 108 | 32768 | 21845 | 42.666016 | $2^2$ |
|  | WXGA (1280 × 800 60 Hz) | 71 | 32768 | 14361 | 55.921875 | $2^3$ |
|  | VGA (640 × 480 60 Hz) | 25.18 | 32768 | 5093 | 39.789063 | $2^4$ |
|  | TV (480i 30 Hz) | 15.75 | 32768 | 3186 | 49.78125 | $2^5$ |
| 270 | WQXGA (2560 × 1600 60 Hz RB) | 268.5 | 32768 | 32586 | 63.644531 | $2^2$ |
|  | WSXGA (1680 × 1050 60 Hz) | 146.25 | 32768 | 17749 | 34.666016 | $2^2$ |
|  | SXGA (1280 × 1024 60 Hz) | 108 | 32768 | 13107 | 51.199219 | $2^3$ |
|  | WXGA (1280 × 800 60 Hz) | 71 | 32768 | 8616 | 33.65625 | $2^3$ |
|  | VGA (640 × 480 60 Hz) | 25.18 | 32768 | 3056 | 47.75 | $2^5$ |
|  | TV (480i 30 Hz) | 15.75 | 32768 | 1911 | 59.71875 | $2^6$ |

Figure 7:
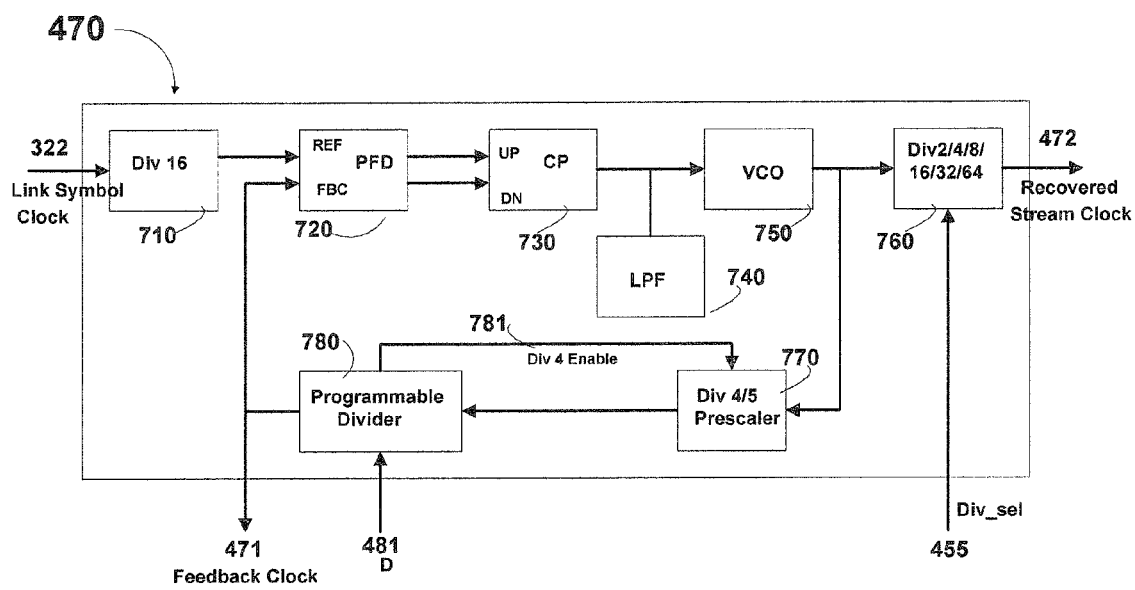
FIG. 7 shows a PLL with pulse-swallow divider consistent with some embodiments of the present invention.

FIG. 7 shows a block diagram of a PLL with pulse-swallow divider 470 consistent with some embodiments of the present invention. The PLL 470 consists of the following components: a frequency divider 710 dividing by 16; PFD (Phase/Frequency Detector) 720; CP (Charge Pump) 730; LPF (Low-Pass Filter) 740; VCO (Voltage Controlled Oscillator) 750; dual-modulus prescaler 770 dividing by 4 or 5; programmable frequency divider 780; and another output program-fractional signal 452 (F) and output integer signal 462 (I2) are illustrated at the left side of the diagram. Each integrator can be enabled or disabled independently via Carry out switches for programming SDM in a desired one of three modes: fractional-N synthesizer without an integrator, a fractional-N synthesizer with the second order sigma-delta (ΔΣ) noise shaping, and a fractional-N synthesizer with the third order sigma-delta (ΔΣ) noise shaping. There is a full input range in this example. There will be no system stability problems. Table 2 lists different parameters in the three modes of a programmable 3 stage SDM described above.

TABLE 2

Programmable SDM Summary

| Mode | NTF* | Output range | Output bits | Divisor range |
|---|---|---|---|---|
| Fractional-N without accumulator | no | 2 level (0→1) | 1 | 31→66 |
| Fractional-N with $2^{nd}$ ΔΣ | $(1-Z^{-1})^2$ | 4 level (1→2) | 3 (1 bit for sign) | 30→67 |
| Fractional-N with $3^{rd}$ ΔΣ | $(1-Z^{-1})^3$ | 8 level (3→4) | 4 (1 bit for sign) | 28→69 |

Noise transfer function
$Z^{-1}$ is the delay symbol

The foregoing description is intended to illustrate but not to limit the scope of the invention, which is defined by the scope of the appended claims. Other embodiments are within the scope of the disclosure.

What is claimed is:

1. A stream clock recovery device, comprising:
a sink device coupled to receive data from a link channel, the data including frequency clock data;
the sink device comprising:
a data extractor to extract the frequency clock data to obtain extracted frequency clock data;
a data calibrator to adjust the extracted frequency clock data to obtain adjusted frequency clock data;
a data translator having an integer and fraction value generator, generating an integer part and a fractional part of the adjusted frequency clock data;
a phase locked loop (PLL) for synthesizing a recovered stream clock from the integer part and the fractional part of the adjusted frequency clock data, wherein the PLL is a pulse-swallow divider, and wherein the PLL with pulse-swallow divider further comprises:
a first frequency divider for dividing an input clock ratio into a reference clock;
a second frequency divider for dividing a clock output into an output clock, wherein the second frequency divider is configured to divide by multiple factors;
a phase/frequency detector coupled to receive the reference clock and a feedback clock and to provide up and down signals;
a charge pump coupled to receive the up and down signals;
a low-pass filter coupled to an output signal of the charge pump;
a voltage controlled oscillator coupled to receive the output signal of the charge pump for frequency synthesis to generate the clock output; and
a third frequency divider and a prescaler coupled to the voltage controlled oscillator for fractional divisional control, wherein the third frequency divider is programmable and the third frequency divider generates the feedback clock; and
a sigma-delta-modulator (SDM) for generating an integer divisor for the PLL by modulating the fractional part of the clock data.

2. The stream clock recovery device of claim 1, wherein the data calibrator includes a cycle time counter, wherein the data calibrator measures the recovered stream clock with the counter to obtain recovered clock data and compares the measured recovered clock data with the extracted clock data.

3. The stream clock recovery device of claim 1, further comprising a calibration selection switch to choose among different calibration techniques in the data calibrator.

4. The stream clock recovery device of claim 1, wherein the data translator provides a first divisor for the second frequency divider in the PLL, and the SDM provides a second divisor for the third frequency divider in the PLL.

5. The stream clock recovery device of claim 1, wherein the SDM is programmable, and wherein the SDM comprises an integrator.

6. The stream clock recovery device of claim 5, wherein the integrator comprises three series coupled integrators that are independently controllable to program the SDM.

7. The stream clock recovery device of claim 1, further comprising a data buffer, and a data buffer filling level of the data buffer being monitored by the data calibrator periodically.

8. A method of recovering a stream clock, comprising:
extracting frequency clock data from a link channel;
adjusting the frequency clock data to obtain adjusted frequency clock data;
generating an integer part and a fractional part of the adjusted frequency clock data;
modulating the fractional part with a sigma-delta-modulator (SDM) to obtain a modulated fractional part of the adjusted frequency clock data; and
synthesizing, by a phase locked loop (PLL), a recovered stream clock from the integer part and the modulated fractional part of the adjusted frequency clock data, wherein the PLL is a pulse-swallow divider, and wherein the PLL with pulse-swallow divider further comprises:
a first frequency divider for dividing an input clock ratio into a reference clock;
a second frequency divider for dividing a clock output into an output clock, wherein the second frequency divider is configured to divide by multiple factors;
a phase/frequency detector coupled to receive the reference clock and a feedback clock and to provide up and down signals;
a charge pump coupled to receive the up and down signals;
a low-pass filter coupled to an output signal of the charge pump;
a voltage controlled oscillator coupled to receive the output signal of the charge pump for frequency synthesis to generate the clock output; and
a third frequency divider and a prescaler coupled to the voltage controlled oscillator for fractional divisional control, wherein the third frequency divider is programmable and the third frequency divider generates the feedback clock.

9. The method of claim 8, wherein adjusting the frequency clock data includes generating recovered clock data from the recovered stream clock and comparing the recovered clock data with the frequency clock data to adjust the frequency clock data.

10. The method of claim 8, wherein adjusting the frequency clock data includes monitoring a data buffer filling level of a data buffer.

* * * * *